United States Patent [19]

Otsuki et al.

[11] Patent Number: 5,474,641

[45] Date of Patent: Dec. 12, 1995

[54] PROCESSING METHOD AND APPARATUS THEREOF

[75] Inventors: Hayashi Otsuki, Nirasaki; Yoichi Deguchi, Machida, both of Japan

[73] Assignee: Tokyo Electron Kabushiki Kaisha, Tokyo, Japan

[21] Appl. No.: 138,439

[22] Filed: Oct. 20, 1993

[30] Foreign Application Priority Data

Oct. 23, 1992 [JP] Japan .................... 4-309412

[51] Int. Cl.$^6$ .................................... C23F 1/02
[52] U.S. Cl. ............. 156/345; 156/640.1; 156/644.1; 118/731; 118/719
[58] Field of Search .................... 156/640.1, 345, 156/644.1, 646.1, 653.1; 118/731, 719; 216/64, 80

[56] References Cited

U.S. PATENT DOCUMENTS

| | | | |
|---|---|---|---|
| 4,817,559 | 4/1989 | Ciparisso | 118/731 |
| 5,135,608 | 8/1992 | Okutani | 156/643 |
| 5,171,393 | 12/1992 | Moffat | 156/345 |
| 5,174,855 | 12/1992 | Tanaka | 156/626 |
| 5,176,783 | 1/1993 | Yoshikawa | 156/345 |
| 5,200,017 | 4/1993 | Kawasaki | 156/345 |
| 5,227,001 | 7/1993 | Tamaki | 156/345 |
| 5,248,380 | 9/1993 | Tanaka | 156/626 |
| 5,308,447 | 5/1994 | Lewis | 156/626 |
| 5,336,356 | 8/1994 | Ban | 156/345 |
| 5,372,647 | 12/1994 | Ohmi | 118/719 |

Primary Examiner—R. Bruce Breneman
Assistant Examiner—Joni Y. Chang
Attorney, Agent, or Firm—Beveridge, DeGrandi, Weilacher & Young

[57] ABSTRACT

The present invention relates to a processing chamber that processes an object to be processed in an atmosphere of a processing gas. The processing chamber is provided with a mounting stand having a holder mechanism that holds the object to be processed within the processing chamber. The mounting stand is connected to a rotational mechanism and is free to rotate, and the holder mechanism on the mounting stand is also provided with a separate, independent rotational mechanism whereby the front surface and rear surface of the object to be processed can be rotated (inverted) relative to the mounting stand. Thus the present invention provides a processing method and apparatus therefor in which the front surface and rear surface of the object to be processed can be processed under the same conditions, without having to change the atmospheric status of the object to be processed.

16 Claims, 6 Drawing Sheets

PROCESSING METHOD AND APPARATUS THEREOF

BACKGROUND OF THE INVENTION

The present invention relates to a processing method and an apparatus therefor.

In a conventional processing apparatus, the object to be processed, such as a semiconductor wafer, is housed within a processing chamber and the processing apparatus is used to implement various processes by applying a processing gas uniformly to the semiconductor wafer while it is rotating within the processing chamber.

A predetermined liquid which is, for example, a mixture of hydrofluoric acid and water at either normal pressure or a positive pressure is accumulated in an upper part of the processing apparatus which is, for example, a natural oxide film removal apparatus that removes natural oxides formed on the surfaces of the semiconductor wafer, and a hydrofluoric acid vapor generated therefrom is diffused within the processing chamber. It is well known in the art to support the semiconductor wafer horizontally with the surface thereof that is be processed upward, on a mounting stand of a rotatable circular form in a lower portion of the interior of the processing chamber. The semiconductor wafer is rotated by rotating the mounting stand, and also the hydrofluoric acid vapor is applied to the surface of the semiconductor wafer in accordance with the rotational fluid flows created by the rotation of the mounting stand, and thus the natural oxide film formed on the surface of the semiconductor wafer is removed by the processing of this apparatus.

However, this method has a disadvantage in that, although the object to be processed is held by a holder mechanism that is provided on a rotatable mounting stand and is rotationally processed while in an atmosphere of a processing gas, the front and rear surfaces cannot be inverted during the processing of the natural oxide film or oxide film formed on the upper surface of the object to be processed, and thus it is impossible to uniformly remove the natural oxide film or oxide film formed on the rear surface of the object to be processed.

In addition, since it is not possible to uniformly remove the natural oxide film formed on the rear surface of the object to be processed, the coefficient of thermal expansion of the object to be processed and the coefficient of thermal expansion of the natural oxide film portion will be different when the object to be processed is passed to an apparatus that performs a subsequent process, such as a thermal processing apparatus that is a film-formation apparatus, and thus thermal stresses will be generated by the unevenness in thermal expansion between the central and peripheral portions of the object to be processed, which will reduce the yield.

When heavy metal contamination of the object to be processed is detected, an acidic solution is supplied to the upper surface of the object to be processed, the heavy metal deposited on the object to be processed is dissolved and removed thereby, or washed away. However, since it is not possible to rotate the front and rear surfaces of the object to be processed, the object to be processed is temporarily conveyed out of the processing apparatus after the front surface of the object to be processed is processed, its rear surface is inverted to become the upper surface, and the object to be processed is conveyed back into the processing apparatus. Thus, during this inversion, if heavy metal is deposited anew on the object to be processed while it is being inverted, there is the problem that the heavy metal contamination of the front and rear surfaces of the object to be processed cannot be analyzed under the same conditions.

SUMMARY OF THE INVENTION

An objective of the present invention is to provide a processing method and apparatus therefor whereby the front and rear (back) surfaces of an object to be processed can be processed under the same conditions, without having to change the atmospheric status of the object to be processed.

The processing apparatus of the present invention is configured as a processing chamber in which an object to be processed is processed in an atmosphere of a processing gas and a mounting stand provided with a holder mechanism which holds the object to be processed within the processing chamber, wherein the mounting stand is connected to a rotational mechanism and also a separate rotational mechanism is provided on the mounting stand for the holder mechanism, whereby the front surface and rear surface of the object to be processed can be rotated relative to the mounting stand.

Thus, the present invention enables a method of processing the front and rear surfaces of an object to be processed under the same conditions, without having to change the atmospheric status of the object to be processed, by a configuration in which a rotational mechanism is provided for the holder mechanism of the mounting stand, and the front surface and rear surface of the object to be processed can be inverted relative to the mounting stand.

DETAILED DESCRIPTION OF THE PREFERRED EMBODIMENTS

Figure 1:
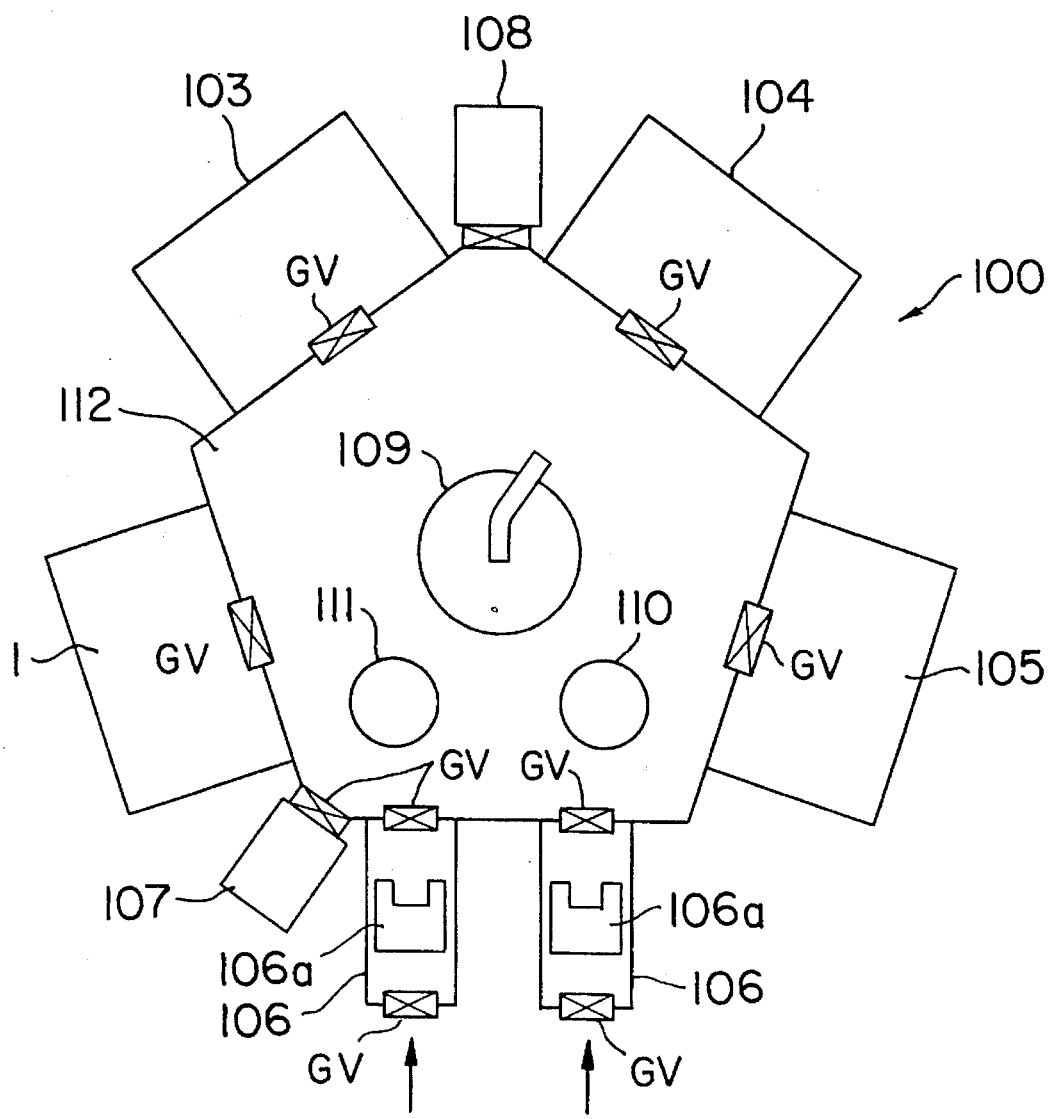
FIG. 1 is a diagram of the overall arrangement of a processing apparatus for an object to be processed, applied to a pre-processing apparatus in accordance with the present invention.

An embodiment of the pre-processing apparatus of the present invention, such as a natural oxide film removal apparatus, applied to a processing apparatus for an object to be processed, such as a semiconductor wafer processing apparatus, will first be described below. As shown in FIG. 1, a processing apparatus 100 comprises a pair of cassette preparation chambers 106 which convey cassettes 106a through gate valves GV by a conveyor robot or manual means, and these cassette preparation chambers 106 cycle repeatedly between atmospheric pressure and a reduced pressure to match the reduced-pressure atmosphere in an adjacent load lock chamber 112. Objects to be processed, such as semiconductor wafers, that have been removed either one-by-one or in batches of several wafers from each cassette 106a are conveyed by a separate conveyor robot 109 arranged within the load lock chamber 112 from the cassette preparation chambers 106 through the gate valves GV and into the load lock chamber 112, and are mounted on an alignment station 110 in order to orientate them.

Each object to be processed, which has been pre-aligned by the alignment station 110, is temporarily mounted on a buffer plate, then is conveyed by the conveyor robot 109 through a gate valve GV into a natural oxide film removal apparatus 1 that is cited as an example of the pre-processing apparatus of the present invention. In this case, after the natural oxide film has been removed from the surfaces of each object to be processed by a mixture of hydrofluoric acid and water, it is temporarily conveyed through another gate valve GV into an adjacent hot-water processing tank 107.

The object to be processed is washed in water of at least 70° C. for approximately 5 minutes in the hot-water processing tank 107, to remove residual hydrofluoric acid from the surfaces thereof. This removal step prevents patterns of a metal such as Al that are formed on the object to be processed from being corroded (note that this hot-water processing tank 107 will be described later).

The object to be processed, from which natural oxide films and residual hydrofluoric acid have been removed, is then conveyed through the gate valve GV by the conveyor robot 109 in the load lock chamber 112 and is subjected to appropriate processing by a film-formation apparatus 103, an exposure apparatus 108, an etching apparatus 104, and an ashing apparatus 105, in the same manner as in conventional processing, and is finally conveyed from the cassette preparation chamber 106 out of the processing apparatus 100 by a conveyor robot that is not shown in the figure.

A first embodiment of the present invention applied to a natural oxide removal apparatus will now be described, with reference to the appended diagrams.

Figure 2:
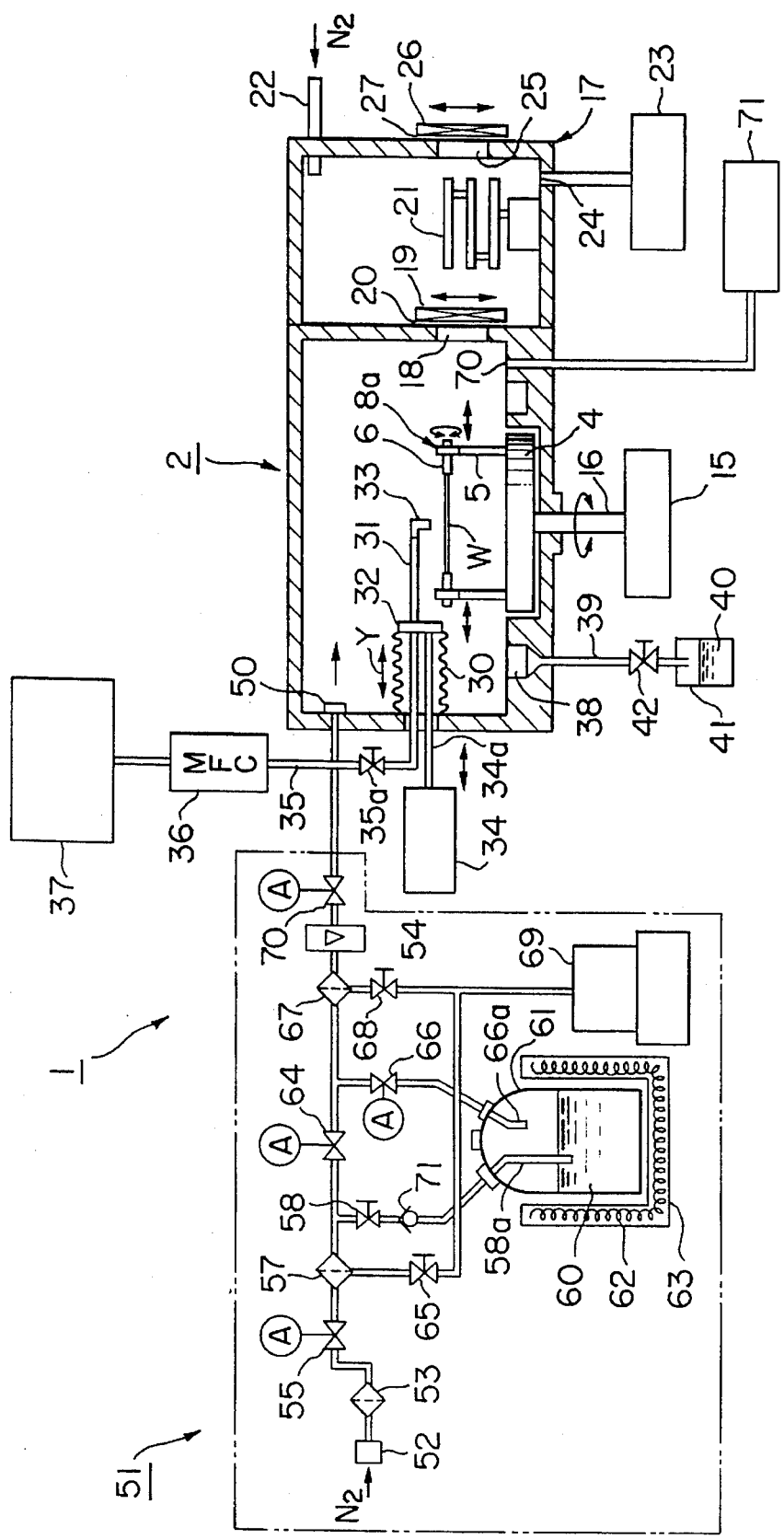
FIG. 2 is an abbreviated cross-sectional view of an embodiment of the present invention used in a pre-processing apparatus of a natural oxide film removal apparatus in accordance with the present invention.
Figure 3:
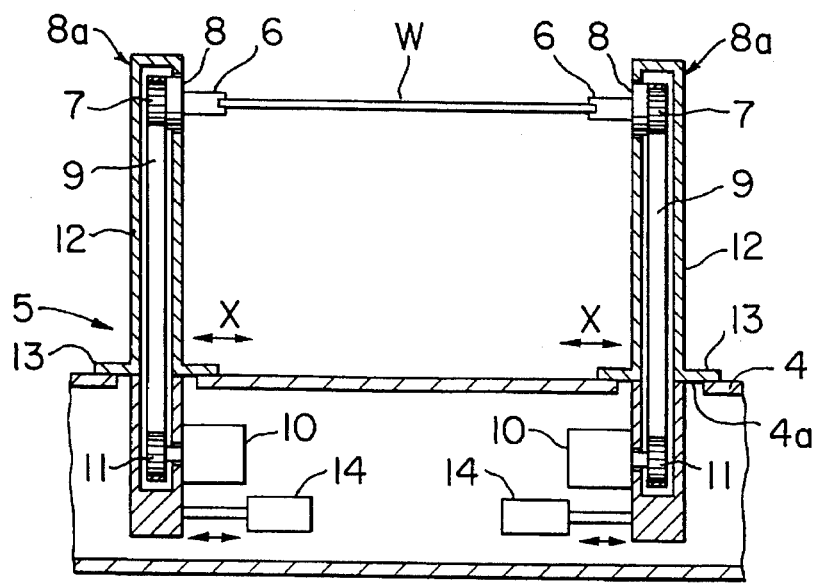
FIG. 3 is a partial abbreviated cross-sectional view of the holder mechanism for the object to be processed, used in the natural oxide film removal apparatus shown in FIG. 2.
Figure 4:
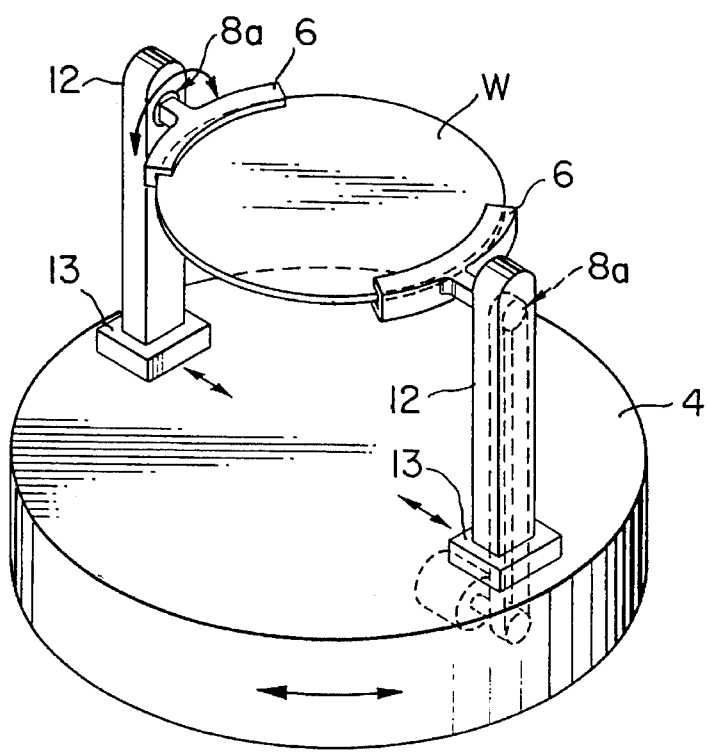
FIG. 4 is a partial abbreviated perspective view of an embodiment of the holder portion of the holder mechanism for the object to be processed shown in FIG. 3.

As shown in FIG. 2 to FIG. 4, the natural oxide film removal apparatus 1 that functions as a pre-processing apparatus has a processing chamber 2 which is formed in a hermetically sealed manner of a corrosion-resistant material such as a fluorocarbon resin.

A mounting stand 4 for mounting the object to be processed, such as a semiconductor wafer W, is provided in a lower portion of the processing chamber 2, and a holder mechanism 5 formed of a corrosion-resistant material and provided with a holder portion 6 that supports the semiconductor wafer W in a floating manner is provided at an upper portion of the mounting stand 4.

The holder portion 6 is fixed to a side surface 8 of a first rotational member 7 of the holder mechanism 5, as shown in FIG. 3. The first rotational member 7 of the rotational mechanism 8a is designed to be rotatable by the rotation of a corresponding second rotational member 11 provided on a rotational means such as a rotational shaft of a pulse motor 10, via a belt 9.

The first rotational member 7, second rotational member 11, and belt 9 are housed in a hollow cylindrical portion that is formed in a hermetically sealed manner within a support post 12, and the support post 12 is inserted and mounted into an opening portion 4a of the mounting stand 4.

A slide plate 13 is provided at an intermediate position of the support post 12, with the lower surface of the slide plate 13 and the upper surface of the mounting stand 4 forming an airtight seal. The slide plate 13 can be moved in the directions shown by the arrows X in FIG. 3 by a horizontal movement means, such as an air cylinder 14, provided within the mounting stand 4.

A second holder mechanism 5 of the same configuration as the above-described holder mechanism 5 is provided on the upper surface of the mounting stand 4 in such a manner that the two holder mechanisms 5 are on either side of the center of the mounting stand 4 and the two holder portions 6 face each other. The holder portions 6 of the pair of first and second holder mechanisms 5 are configured in such a manner that a maximum of ½ of the entire peripheral edge portion of the semiconductor wafer W is held as shown in FIG. 4 by the holder portion 6 of the first holder mechanism 5 which is formed of, for example, a corrosion-resistant material.

In addition, a rotational means 15, such as a stepping motor, is provided in a lower portion of the mounting stand 4, as shown in FIG. 2, and is configured in such a manner that it can rotate the mounting stand 4 via a rotational shaft 16.

Figure 9:
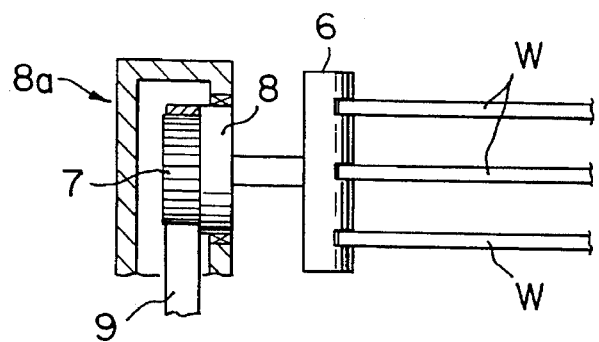
FIG. 9 shows another embodiment of the holder portion of the holder mechanism for the object to be processed shown in FIG. 3.

Note that each holder portion 6 could be formed as a flange shape with a plurality of grooves (such as three grooves) formed in the flange surface thereof, in such a manner that the pair of holder portions 6 can hold and rotate a plurality of objects to be processed, as shown in FIG. 9.

A load lock chamber 17 is provided to one side of the processing chamber 2 and is connected in a hermetically sealed manner to the processing chamber 2, as shown in FIG. 2. A first conveyor passage 18 opens between the load lock chamber 17 and the processing chamber 2 in order to allow the semiconductor wafer W to be conveyed into and out of the load lock chamber 17. A first opening door, such as a gate valve 19, which is provided to seal off the first conveyor passage 18, is configured of a first sealing member 20 which could be an O-ring formed of a corrosion-resistant material, arranged in such a manner as to be capable of hermetically sealing the processing chamber 2.

A wafer conveyor mechanism (robot) 21 is provided in the load lock chamber 17 and is configured in such a manner as to be capable of conveying the semiconductor wafer W into and out of the processing chamber 2.

One end of the load lock chamber 17 is connected to an introduction pipeline 22 for introducing an inert gas, such as $N_2$, thereinto and the other end thereof is connected to an exhaust apparatus 23 by an exhaust pipeline 24, so that the load lock chamber 17 can be held at either atmospheric pressure or a reduced pressure. A second conveyor passage 25 opens in a side wall of the load lock chamber 17 in order to allow the semiconductor wafer W to be conveyed into and out of the load lock chamber 17. A second opening door, such as a gate valve 26, which is provided to seal off the first conveyor passage 18, is configured of a second sealing member 27 which could be an O-ring, in such a manner that semiconductor wafers W can be conveyed into and out of the load lock chamber 17 with respect to a wafer conveyor chamber that is not shown in the figure.

One end of an extendable bellows 30 is connected hermetically to a side wall of the processing chamber 2 and the other end of the bellows 30 is provided with a supply tube 31 made of a corrosion-resistant material, with a connector portion 32 that is also made of a corrosion-resistant material therebetween, as shown in FIG. 2. The supply tube 31 is provided with a nozzle 33 that has an L-shaped, downward-focused supply port that can supply an acidic liquid, such as a 0.1% to 0.001% solution of nitric acid, to the upper surface of the semiconductor wafer W.

The bellows 30 is provided with an extension means that extends the bellows 30, such as an extension portion (rod) 34a of an air cylinder 34, an end portion of the extension portion 34a is connected to one end of the connector portion 32, and the other end thereof is connected to a supply tube 35 that supplies the nitric acid solution to the supply tube 31.

The supply tube 35 is connected by a switching valve 35a to a flow quantity control apparatus, such as a mass flow controller (MFC) 36, that controls the amount of acidic solution supplied to the upper surface of the semiconductor wafer W, and the mass flow controller 36 is connected to an acid solution tank that contains the nitric acid solution.

An annular reclamation trough 38 for recovering the nitric acid solution is provided in a base portion of the processing chamber 2, around the outer periphery of the mounting stand 4. The reclamation trough 38 is connected to a reclamation tube 39, and nitric acid solution 40 reclaimed thereby is connected to a storage cup 41 by a change-over valve 42 in such a manner that it is stored thereby.

An inner side wall of the processing chamber 2 is pierced by an introduction port 50 for introducing into the processing chamber 2 an inert gas, such as high-purity $N_2$, or a processing gas that uses this $N_2$ as a carrier, such as HF vapor, and the introduction port 50 is connected to a gas introduction means 51. Note that the temperature at which this processing gas is supplied is maintained to within the range of 25° C. to 35° C., preferably at 30° C., to ensure that condensation can be prevented from occur-ring within the processing chamber 2.

Note also that a mixture of anhydrous HF and steam, or a gas using $N_2$ as a carrier gas, could be supplied as the processing gas.

An $N_2$ supply tube 52 that supplies high-purity $N_2$ is provided in the gas introduction means 51, and this $N_2$ supply tube 52 is connected to a filter for ensuring that the high-purity $N_2$ is of an even higher purity, such as a Teflon (registered trademark) filter 53 that removes passing particles of 0.2 μm or less.

The Teflon filter 53 is connected by piping of a corrosion-resistant material, such as Teflon, to another filter such as a Teflon filter 57 that removes passing particles of 0.2 μm or less, with a first switching valve such as an air-operated valve 55 therebetween.

Three passages branch from the Teflon filter 57. Of these, a first passage passes along a pipeline 58a through a second switching valve such as a manual value 58 and a reverse valve 71 into a tank 61 made of a corrosion-resistant material such as Teflon in which a processing liquid such as a mixture 60 of hydrofluoric acid and water ($HF/H_2O$) is collected. Around the outer periphery of the Teflon tank is arranged a constant-temperature bath 63 provided with a heater 62 therein for maintaining the mixed liquid 60 at a constant temperature such as a temperature region of between 0° and 50° C. Note that the HF in the mixed liquid ($HF/H_2O$) within the Teflon tank evaporates at 19.5° C. or higher.

The second of the above passages is connected to a third switching valve such as an air-operated valve 64, and the third passage is connected to a fourth switching valve such as a manual valve 65.

The third switching valve, such as the air-operated valve 64, is plumbed into the second passage and the first passage is connected to a fifth switching valve such as an air-operated valve 66. The air-operated valve 66 is connected to an introduction pipeline 66a for introducing processing gas by bubbling it from the vaporized mixed liquid 60, and the introduction pipeline 66a is also linked to the interior of the Teflon tank 61.

Figure 7:
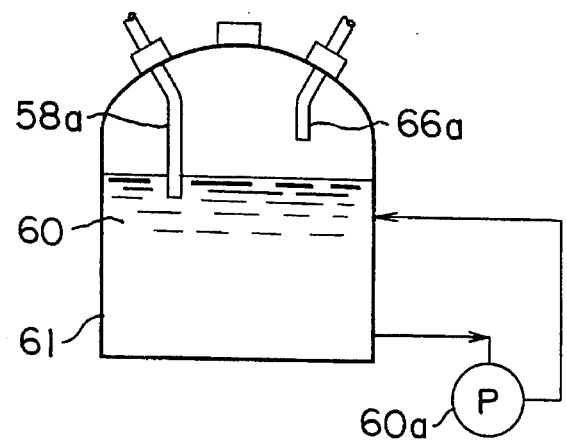
FIG. 7 is an abbreviated lateral cross-sectional view of another embodiment of the tank for the object to be processed (Teflon tank) shown in FIG. 2.

Note that the Teflon tank 61 could be provided with a circulation pump 60a, as shown in FIG. 7, to ensure that the mixed liquid within the Teflon tank 61 is circulated. This ensures that any loss in the mixed liquid is automatically replenished.

The second passage is also connected to a filter such as a Teflon filter 67 that removes passing particles of 0.2 μm or less.

The Teflon filter 67 is connected by a pipeline to a drain tank 69 that reclaims liquid obtained when the processing gas condenses within the pipeline, via a sixth switching valve such as a manual valve 68, and is also linked by a pipeline to a flow meter such as a Fine Meter (tradename) 54 that is used to measure the gas flow quantity.

The Fine Meter 54 is connected by a pipeline to the introduction port 50 of the processing chamber 2, via a seventh switching valve made of a corrosion-resistant material such as Teflon, such as an air-operated valve 70.

In the same way as described above, the fourth switching valve, such as the manual valve 65, is also connected by a pipeline to the drain tank 69, in order to reclaim liquid obtained when the processing gas condenses within the pipeline.

An exhaust port 70 is provided in a base portion of the processing chamber 2 in order to remove the inert gas or processing gas therefrom, an exhaust apparatus such as an extractor 71 that uses the fluid flow to exhaust the gas is connected thereto, and the configuration is such that the inert gas or processing gas is exhausted from the processing chamber 2. The natural oxide film removal apparatus 1 is configured as described above.

Figure 5:
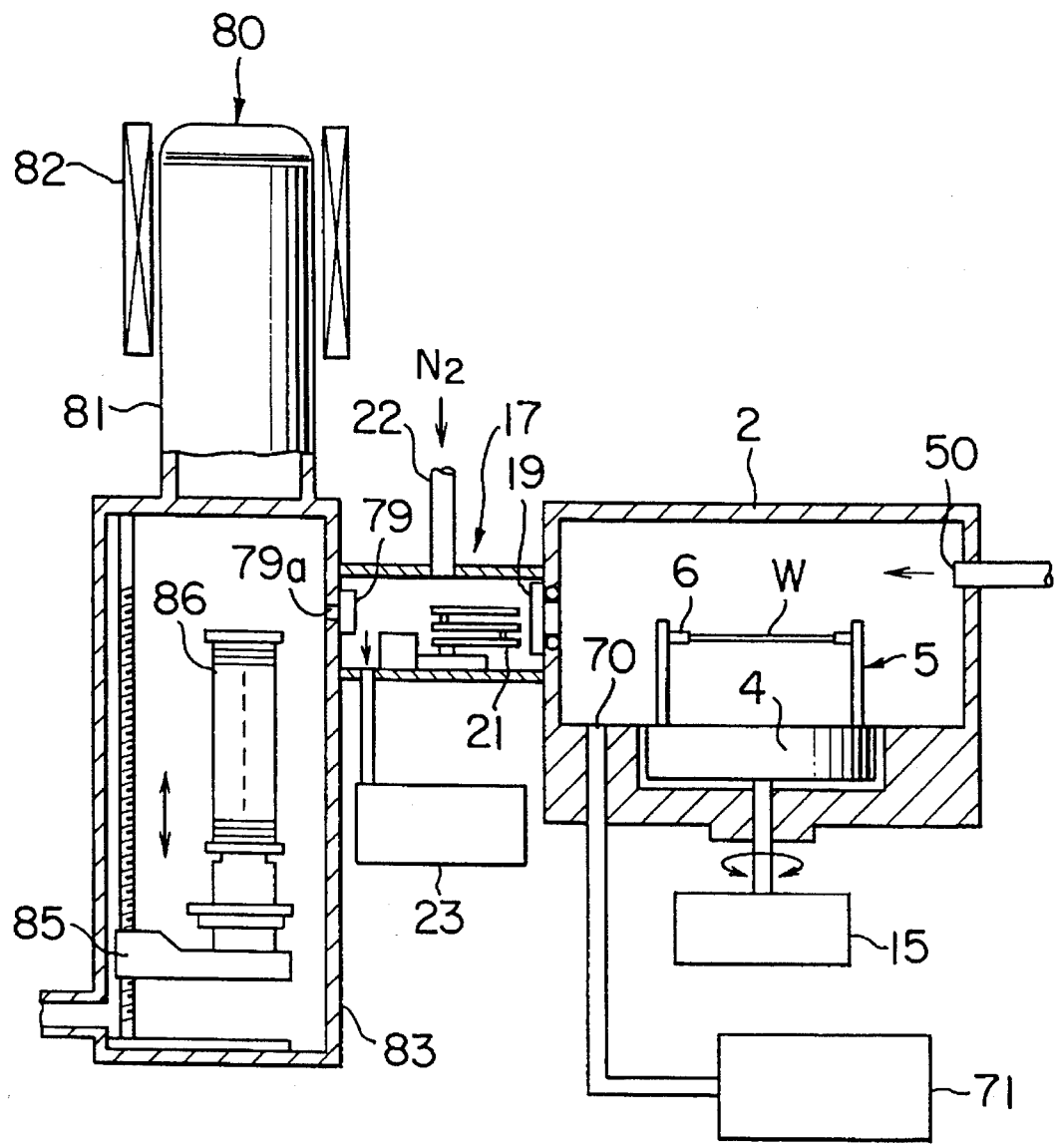
FIG. 5 is an abbreviated lateral cross-sectional view of an embodiment of the present invention used in a system in which the natural oxide film removal apparatus shown in FIG. 2 is connected to a film-formation processing furnace.

A side wall of the load lock chamber 17 could be connected to another system such as a film-formation processing furnace 80 which comprises a reaction vessel 81 that forms a region for film formation, and a heater 82 or other means is provided around the outer periphery of the reaction vessel 81, as shown in FIG. 5. A processing gas is introduced into the reaction vessel 81 and a film is formed therein by CVD or a similar process. The film-formation processing furnace 80 is provided with a wafer mounting/removal chamber 83 in a lower portion of the reaction vessel 81, and the wafer mounting/removal chamber 83 is provided with a wafer boat 86 which is capable of housing up to, for example, 100 of the semiconductor wafers W and which is mounted on a boat elevator mechanism 85 that is elevated by a means such as a ball screw 84.

A third conveyor passage 79a for conveying the semiconductor wafers W into and out of the wafer boat 86 opens into the lDad lock chamber 17, and a third opening door, such as a gate valve 79, which is provided to seal off the third conveyor passage 79a is provided for a side wall thereof.

Figure 8:
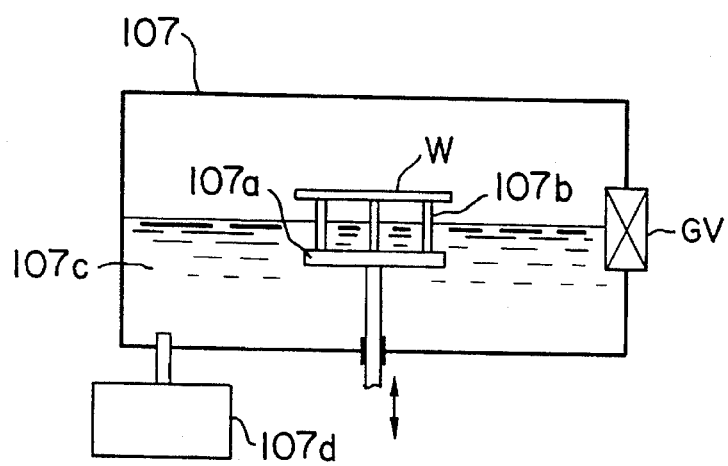
FIG. 8 is an abbreviated lateral cross-sectional view of the hot-water processing apparatus shown in FIG. 1.

The hot-water processing tank which is provided adjacent to the natural oxide film removal apparatus 1 that is the first embodiment of the present invention is configured as shown in FIG. 8. In other words, the hot-water processing tank 107 is provided with a holder member 107a for the object to be processed, the holder member 107a is provided with a number (such as three) of receiver pins 107b, and, after the object to be processed (the semiconductor wafer W) has had natural oxide films removed therefrom, it is conveyed from the load lock chamber 112 using a gate valve GV by the conveyor robot 109 and is placed horizontally on the receiver pins 107b. The holder member 107a is lowered into hot water 107c that is controlled to be at a temperature of at least 70° C. by a hot-water control apparatus 107d, the object to be processed W is washed therein, and thus any residual nitric acid on the surfaces thereof is removed by the hot water.

The processing of the semiconductor wafer W performed by the natural oxide film removal apparatus 1 of this embodiment of the present invention, which is configured as described above, will now be described.

First, the gate valve 19 shown in FIG. 2 is opened and the semiconductor wafer W (of between 6" and 12") is automatically conveyed to a predetermined position within the processing chamber 2 by the wafer conveyor mechanism 21. The semiconductor wafer W is held by the holder portions 6 of the holder mechanisms 5 shown in FIG. 3, by the operation of a method whereby the pair of air cylinders 14 of the holder mechanisms 5 are brought mutually closer.

After the wafer conveyor mechanism 21 has retreated from the processing chamber 2, the gate valve 19 is then closed to hermetically seal the processing chamber 2. In this case, the interior of the processing chamber 2 is held at either normal pressure or a reduced pressure. Note that a reduced pressure would be particularly favorable for the dispersion of a vapor (processing gas).

The gate valves 55, 56, 66, and 70 are then opened in sequence, a processing gas in which $N_2$ is absorbed as a carrier and which has been vaporized in the Teflon tank 61 is introduced into the processing chamber 2, and at the same time the exhaust means 71 is operated to exhaust the interior of the processing chamber 2. Note that the amount of processing gas supplied to the processing chamber 2 by the processing gas flow meter 54 is preferably controlled to be, for instance, 0.1 to 2 Nl/min by the degree of opening of the change-over valve 65. The processing gas is then stably supplied to the processing chamber 2. (The switching valve 64 is subsequently closed.)

The mounting stand 4 is then rotated by the rotational means 15 at a rotational speed of, for example, 10 to 20 revolutions per minute.

This rotation of the mounting stand 4 attracts the processing gas to the upper surface of the semiconductor wafer W so that unwanted natural oxide films of, for example up to 100 Å thick, which are formed on the upper surface of the semiconductor wafer W are removed by the chemical reaction with the processing gas, and then the rotation of the mounting stand 4 is halted.

The semiconductor wafer W is gently rotated by the rotational mechanisms 8a of the holder mechanisms 5 so that the rear surface thereof faces upward. After this rotation, the mounting stand 4 is again rotated as described above so that unwanted natural oxide films of, for example up to 100 Å thick, which are formed on the rear surface of the semiconductor wafer W are removed by the chemical reaction with the processing gas, and then the rotation of the mounting stand 4 is halted.

This removal of the natural oxide films from both the surfaces of the semiconductor wafer W gives the surfaces hydrophobic properties.

The change-over valve 66 is then closed, and thus only highly pure $N_2$ is supplied to the interior of the processing chamber 2 to purge it of any residual processing gas.

The nozzle 33 provided at the tip of the supply tube 31 is moved by the extension means 34 to the central position of the semiconductor wafer W, the mass flow controller 36 controls the flow of acidic nitric acid solution and also the change-over valve 35a opens to supply a suitable quantity thereof, such as 0.5 to 5.5 ml (litter), to the upper surface of the semiconductor wafer W. After this solution is supplied, the mounting stand 4 is rotated at a rotational speed of between, for example, 1 to 100 revolutions per minute, so that any heavy metal deposited on the upper surface of the semiconductor wafer W, such a Na, K, Fe, Cu, Ni, or Cr, is dissolved by this acidic nitric acid solution and is removed thereby. After this processing, the nitric acid solution flows into the reclamation trough 38 for reclaiming the nitric acid solution and is collected in the storage cup 41 through the reclamation tube 39 by the release of the change-over valve 42.

The rear surface of the semiconductor wafer W is again placed upwards by the rotation of the rotational mechanisms 8a of the holder mechanisms 5. After this rotation, any heavy metal deposited on the semiconductor wafer W is removed by the nitric acid solution in the same way as described above.

After this removal, the rotation of the mounting stand 4 is halted, the gate valve 19 is released, the air cylinders 14 of the holder mechanisms 5 are moved in an expansion (opening) direction as shown in FIG. 3 so that the hold is released, the semiconductor wafer W is conveyed by the wafer conveyor mechanism 21 shown in FIG. 2 into the load lock chamber 17 which is outside the processing chamber 2, then the gate valve 19 is closed.

Next, if, for example, the semiconductor wafer W that has been conveyed into the load lock chamber 17 by the wafer conveyor mechanism 21 is to be subjected to film-formation processing, as shown in FIG. 5, it is conveyed into the wafer boat 86 of the film-formation processing furnace 80 through the third gate valve 79, and, after the number of semiconductor wafers W therein has reached the number required for batch processing, such as 100 wafers, the boat elevator mechanism 85 is elevated and the film-formation processing is performed.

In a similar manner, the steps of processing the semiconductor wafers W are repeated in sequence.

The effects of this embodiment of the processing method and apparatus in accordance with the present invention configured as described above, will be described below.

(1) When heavy metals deposited on the surfaces of the semiconductor wafer W are to be dissolved and washed away by the acidic nitric acid solution, the front and rear surfaces of the semiconductor wafer W can be inverted by the rotational mechanisms 8a of the holder mechanisms 5. Therefore, after the front surface of the object to be processed has been processed, there is no need to convey the object to be processed temporarily out of the processing chamber in order to invert it and place the rear surface upwards and then convey it back into the processing chamber. This means that heavy metals on both the front and rear surfaces of the object to be processed can be removed or washed off under the same conditions, and thus heavy metals can be prevented from being deposited thereon anew. This process also enables accurate and efficient analysis of the heavy metals by a method such as atomic absorption spectroscopy (AAS).

(2) Since any heavy metals deposited on the semiconductor wafer W can be removed as described above, adverse effects in the processing of subsequent stages can be prevented. These adverse effects include pressure defects in oxide films (the effects of heavy metals such as Na or K) in components such as integrated circuits on the semiconductor wafer, current leakage in p-n junctions (the effects of heavy metals such as Fe, Cu, Ni, and Cr), degradation in low carrier lifetimes (the effects of heavy metals such as Fe and Ni), and crystal defects (the effects of heavy metals such as Fe and Ni).

(3) Since the front and rear surfaces of the semiconductor wafer W can be inverted by the rotational mechanisms 8a of the holder mechanisms 5, processing can be done under the same conditions without changing the atmospheric status of the semiconductor wafer W, and thus the natural oxide films formed on each of the front and rear surfaces can be processed uniformly. In addition, the coefficient of thermal expansion of the object to be processed such as a semiconductor wafer (Si) (which has a linear coefficient of thermal expansion of approximately 2.5 [10–6 deg-1] at a temperature of 293K) and the coefficient of thermal expansion of a natural oxide film ($SiO_2$) portion (which has a linear coefficient of thermal expansion of approximately 7.4 to 13.6 [10–6 deg-1] at a temperature of 293K) are different. However, since the natural oxide film on the rear surface of the object to be processed can be removed uniformly before the object to be processed is subjected the processing of a subsequent stage, such as in a thermal processing apparatus, when processing is done at a processing temperature of the thermal processing apparatus of, for example, 800° to 1200° C., the thermal expansion of the central portion and the peripheral portion of the object to be processed can be kept uniform, and thus thermal stresses can be prevented from occurring.

A second embodiment of the holder mechanism used in the present invention will now be described. Components that are the same as those of the first embodiment are given the same reference numbers and descriptions thereof are omitted.

Figure 6:
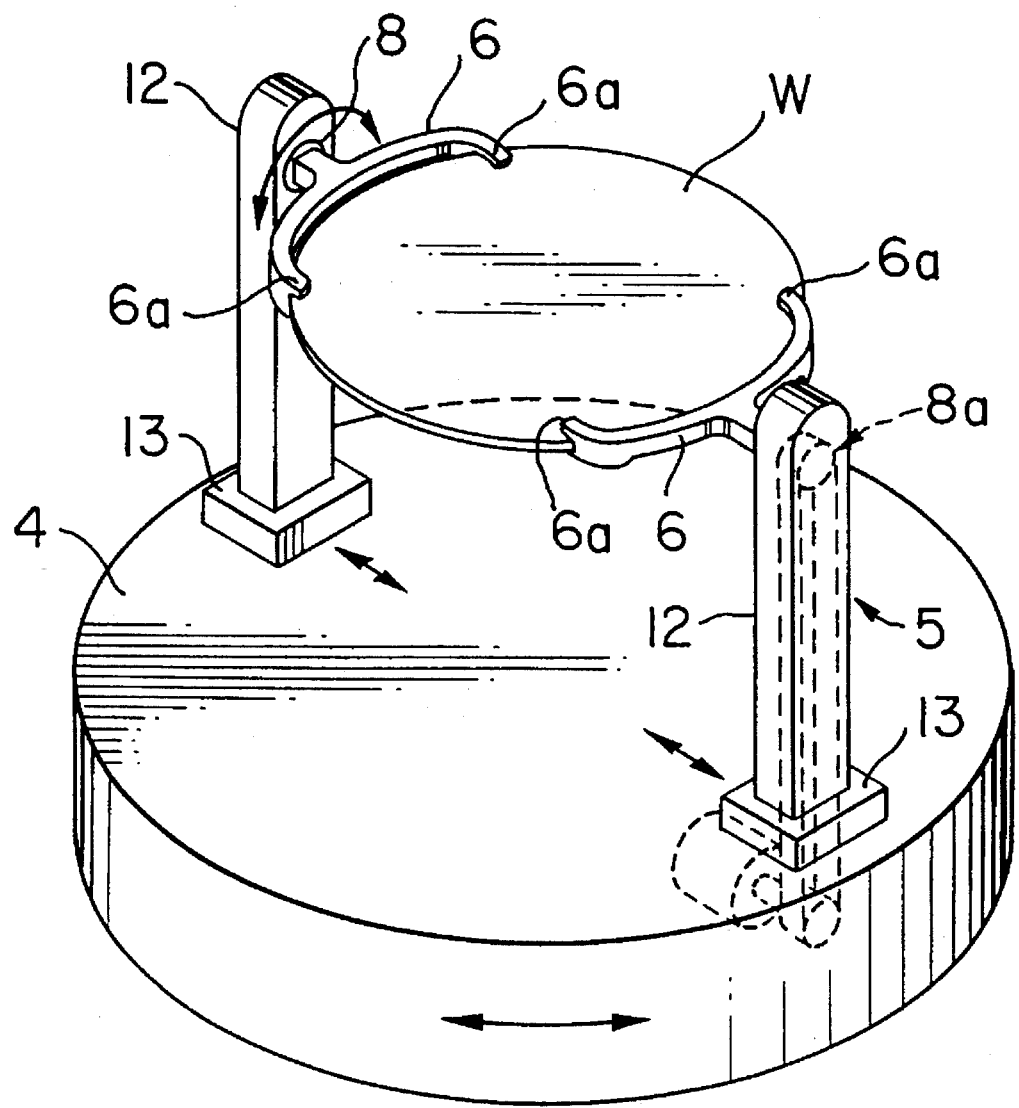
FIG. 6 is a partial abbreviated perspective view of another embodiment of the holder portion of the holder mechanism for the object to be processed shown in FIG. 3.

The second embodiment is provided with the rotational mechanism 8a in each holder mechanism 5, and each holder portion 6 that grasps the semiconductor wafer W is provided with grasping portions 6a that are in point contact with the semiconductor wafer W, as shown in FIG. 6. In this case, each holder portion 6 of the holder mechanism 5 has two holder points 6a, so that the semiconductor wafer W is grasped by four holder points 6a. Therefore, after the upper surface of the semiconductor wafer W has been bathed in the acidic nitric acid solution to dissolve the heavy metals therefrom, when it comes to removing the acidic nitric acid solution from the upper surface of the semiconductor wafer W by rotating the mounting stand 4, the acidic nitric acid solution can be more efficiently prevented from remaining in the holder portions 6.

It should be noted that the above description has concerned the present invention applied to a natural oxide removal apparatus that removes natural oxide films formed on the surfaces of a semiconductor wafer. However, embodiments of the present invention are not limited thereto, and the present invention can also be applied equally well to any kind of apparatus that has a step of supplying a processing fluid to the surfaces of an object to be processed, and various modifications to the present invention can thus be conceived within the scope of the present invention.

The present invention is also not limited to the processing of natural oxide films; it can of course be applied to the processing of any oxide or nitride film, and a single rotational drive means can be used as the rotational mechanism of the holder mechanism. It should be obvious to those skilled in the art that the movement means of the holder posts of the holder mechanism could be a motor, and various modifications thereto can be conceived within the scope of the present invention.

The present invention is similarly not limited to a natural oxide removal apparatus; it can also be applied to a washing apparatus or other type of etching apparatus, in fact to any kind of processing apparatus, provided the processing apparatus preforms processing with a processing gas on an object to be processed within a processing chamber at normal pressure, reduced pressure, or elevated pressure.

What is claimed is:

1. A processing apparatus provided with a processing chamber in which an object to be processed is processed in an atmosphere of a processing gas, said processing apparatus comprising:

a rotational means, a mounting stand connected to said rotational means, a pair of holders provided uprightly on said mounting stand to hold said object to be processed therebetween within said processing chamber, and, another rotational mechanism provided with said holders for rotating said object to be processed, whereby a front surface and a rear surface of said object to be processed are repeatedly inverted relative to a plane perpendicular to the upper surface of said mounting stand during processing of said object to be processed.

2. The processing apparatus of claim 1, wherein said apparatus includes a supply pipeline located over said holders for supplying an acidic solution to an upper surface of said object to be processed.

3. The processing apparatus of claim 1, wherein said holders each have a holder portion that supports the front surface and the rear surface of said object to be processed, and that also supports a peripheral edge portion of said object to be processed at at least two points.

4. The processing apparatus of claim 1, wherein said processing apparatus is a natural oxide removal apparatus for an object to be processed that uses a vapor of a mixture of fluorine and water as said processing gas, and said processing apparatus is provided with a hot-water processing tank adjacent thereto in which said object to be processed is washed in hot water of a temperature controlled to be at least 70° C., in order to remove residual fluorine after the processing thereof.

5. The processing apparatus of claim 1, wherein said processing apparatus is a natural oxide removal apparatus for an object to be processed that uses a vapor of a mixture of fluorine and water as said processing gas, and said vapor is supplied to said processing chamber by using $N_2$ as a carrier gas.

6. The processing apparatus of claim 1, wherein said processing apparatus is a natural oxide removal apparatus for an object to be processed that uses a vapor of a mixture of fluorine and water as said processing gas, and said mixture is housed in a tank and circulated by a pump.

7. A processing apparatus provided with a processing chamber in which an object to be processed is processed in an atmosphere of a processing gas, said processing apparatus comprising:

a rotational means, a mounting stand connected to said rotational means, a pair of holders provided uprightly on said mounting stand to hold said object to be processed therebetween within said processing chamber, a supply pipeline for supplying an acidic solution to an upper surface of said object to be processed, and another rotational mechanism provided with said holders for rotating said object to be processed, whereby a front surface and a rear surface of said object to be processed are repeatedly inverted relative to a plane perpendicular to the upper surface of said mounting stand.

8. The processing apparatus of claim 7, wherein said supply pipeline for supplying an acidic solution to an upper surface of said object to be processed is provided with a movement means that can move between a central position of said object to be processed and a position whereat it can escape from an upper portion of said object to be processed.

9. The processing apparatus of claim 7, wherein said solution is a nitric acid solution.

10. A method of processing an object to be processed in an atmosphere of a processing gas by use of a processing chamber means, the processing chamber means including a rotatable means, a mounting stand connected to the rotatable means to be rotated thereby, a pair of holders disposed uprightly on the mounting stand, each of the holders having an object holder portion, and another rotatable means provided with the holders, said processing method comprising the steps of:

supporting an object to be processed between the holders by the object holder portions, causing the rotatable means to rotate the mounting stand together with said object to be processed in a predetermined direction; and causing the rotatable means to stop rotation of the mounting stand, and causing the another rotatable means to rotate the object holder portions to invert a front surface and a rear surface of said object to be processed relative to a plane perpendicular to the upper surface of the mounting stand.

11. The processing method of claim 10, wherein said processing is the removal of natural oxide films from the surface of a semiconductor wafer, a vapor of a mixture of fluorine and water is used as said processing gas, and the temperature at which said processing gas is supplied is within the range of 25° to 35° C.

12. The processing method of claim 10, wherein said object to be processed held by the object holder portions is rotated in a constant direction while said processing gas is being supplied.

13. The processing method of claim 10, wherein said processing is the removal of natural oxide films from the surface of a semiconductor wafer, a vapor of a mixture of fluorine and water is used as said processing gas, and, after said natural oxide film removal is completed, surplus fluorine is removed from the surface of said semiconductor wafer by hot-water processing in water of a temperature of at least 70° C.

14. The processing method of claim 10, wherein said processing is performed under normal pressure or reduced pressure.

15. The processing method of claim 10, wherein one of film-formation processing, etching, and ashing is performed after said processing is completed.

16. The processing method of claim 10, wherein hot-water processing is performed after said processing, and subsequently etching or aching is performed.

\* \* \* \* \*